(12) United States Patent
Koshihara et al.

(10) Patent No.: US 7,737,637 B2
(45) Date of Patent: Jun. 15, 2010

(54) ORGANIC ELECTROLUMINESCENCE DEVICE HAVING INPUT FUNCTION AND ELECTRONIC APPARATUS

(75) Inventors: Takeshi Koshihara, Suwa (JP); Sumio Utsunomiya, Matsumoto (JP); Takeyoshi Ushiki, Shiojiri (JP); Yoichi Fujikawa, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 176 days.

(21) Appl. No.: 12/029,880

(22) Filed: Feb. 12, 2008

(65) Prior Publication Data

US 2008/0211395 A1 Sep. 4, 2008

(30) Foreign Application Priority Data

Mar. 2, 2007 (JP) ............................. 2007-052548

(51) Int. Cl.
*H01J 1/62* (2006.01)
(52) U.S. Cl. ...................... 313/512; 313/506; 313/509
(58) Field of Classification Search .......... 313/582–587
See application file for complete search history.

(56) References Cited

U.S. PATENT DOCUMENTS

| | | | | |
|---|---|---|---|---|
| 2002/0180910 | A1* | 12/2002 | Umemoto et al. | 349/113 |
| 2003/0067448 | A1* | 4/2003 | Park | 345/173 |
| 2003/0067449 | A1* | 4/2003 | Yoshikawa et al. | 345/173 |
| 2004/0238726 | A1* | 12/2004 | Caldwell | 250/221 |
| 2005/0184971 | A1* | 8/2005 | Ogino et al. | 345/173 |
| 2006/0001655 | A1* | 1/2006 | Tanabe | 345/176 |
| 2006/0044279 | A1* | 3/2006 | Nasu et al. | 345/169 |
| 2006/0250373 | A1* | 11/2006 | Sakurai et al. | 345/173 |
| 2007/0002192 | A1* | 1/2007 | Nishino et al. | 349/12 |

FOREIGN PATENT DOCUMENTS

| | | |
|---|---|---|
| JP | A-2003-196023 | 7/2003 |
| JP | A-2006-146895 | 6/2006 |

\* cited by examiner

*Primary Examiner*—Bumsuk Won
(74) *Attorney, Agent, or Firm*—Oliff & Berridge, PLC

(57) ABSTRACT

The invention provides an organic electroluminescence device having an input function, including: an element substrate that has a light-emitting layer sandwiched between a pair of electrodes; a sealing substrate that seals the element substrate; a first detection electrode that is provided at the inner-surface side of the sealing substrate; a second detection electrode that is provided at the outer-surface side of the sealing substrate; the second detection electrode having a detection axis that is not the same as that of the first detection electrode; a dielectric film that is formed on the second detection electrode; and a detection unit that detects a position at which electrostatic capacitance is generated via the dielectric film between the first detection electrode and the second detection electrode.

6 Claims, 8 Drawing Sheets

ORGANIC ELECTROLUMINESCENCE DEVICE HAVING INPUT FUNCTION AND ELECTRONIC APPARATUS

BACKGROUND

1. Technical Field

The present invention relates to an organic electroluminescence device that has an input function. The invention further relates to an electronic apparatus that is provided with such an organic electroluminescence device.

2. Related Art

Small-sized information and electronic devices such as personal digital assistants (PDA) and personal computers have become widely used in recent years. With the increasing use of these devices, display devices having a so-called touch panel function have also come into wide use. A display device having a touch panel function allows a user to manually input instructions or the like therein; specifically, a user can make an input by contacting a touching object such as a finger, a pen, or the like, onto the display screen of such a touch-panel display device. In the technical field of touch panel display devices, a capacitive sensing scheme is known as an example of a method for detecting the contact position of a touching object such as a finger or the like, which is disclosed in, for example, JP-A-2006-146895 and JP-A-2003-196023. The capacitive sensing scheme is defined as a method for detecting the contact position of, for example, a finger or the like by means of electrostatic capacitance. When a user touches on the touch-sensitive display screen of a touch panel, electrostatic capacitance is generated. A weak electric current flows as electrostatic capacitance is generated. In the capacitive sensing scheme, the contact position of a touching object is detected on the basis of the amount of such a weak electric current that flows as electrostatic capacitance is generated. A detection electrode that is formed as a sheet and a dielectric film that is deposited on the planar (i.e., sheet-type) detection electrode are used in the capacitive sensing scheme. With such a configuration, in the capacitive sensing scheme, electrostatic capacitance is generated when a user touches on the dielectric film with their finger.

A touch-sensitive liquid crystal device of the related art that conforms to the capacitive sensing scheme has a problem of a possible contact position detection error due to an electric field noise. That is, since an electric field, which is generated by a driving signal that is supplied between a pair of electrodes for driving a liquid crystal layer, undesirably reaches a detection electrode, the accuracy in the detection of a contact position decreases because of the electric field component that disturbs the functioning of the detection electrode as a noise. In order to address such a noise problem, the first-mentioned patent publication described above discloses a noise-cutting technique, which rejects a noise by means of a noise-cutting signal that is generated from a driving signal.

However, according to the configuration of the related-art liquid crystal device having a touch panel function described above, the following technical problem remains to be solved. That is, the touch-sensitive liquid crystal device of the related art described above has a technical disadvantage in that it requires a complex system for the generation of a noise-cutting signal. Therefore, there is a demand for a display device having a touch panel function that can overcome an electric field noise problem described above without involving a complex system, which is not desirable.

SUMMARY

An advantage of some aspects of the invention is to provide an organic electroluminescence device that is capable of achieving noise-suppressed contact position detection with a high precision in a reliable manner. In addition, the invention further provides, advantageously, an electronic apparatus that is provided with such a high-performance organic electroluminescence device to offer reliable contact position detection with enhanced detection accuracy.

As the fruits of devoted and committed efforts made by the inventors who have conceived the technical idea of the present invention, it is found that an organic electroluminescence device is less susceptible to a noise that is attributable to an electric field component generated by a driving signal that is applied between a pair of electrodes. That is, the inventors of the subject application have reached technical findings that, since a pair of electrodes that sandwiches an organic electroluminescence layer is formed at the element-substrate side only in the configuration of an organic electroluminescence device, a sealing substrate of the organic electroluminescence device that is opposed to the element substrate thereof is relatively free from an electric field noise. On the basis of the technical findings described above, the inventors of the subject application have arrived at the novel and inventive idea of the present invention.

In order to address the above-identified problem without any limitation thereto, the invention provides, as a first aspect thereof, an organic electroluminescence device having an input function, including: an element substrate that has a light-emitting layer sandwiched between a pair of electrodes; a sealing substrate that seals the element substrate; a first detection electrode that is provided at the inner-surface side of the sealing substrate; a second detection electrode that is provided at the outer-surface side of the sealing substrate, the second detection electrode having a detection axis that is not the same as that of the first detection electrode; a dielectric film that is formed on the second detection electrode; and a detecting section that detects a position at which electrostatic capacitance is generated via the dielectric film between the first detection electrode and the second detection electrode.

In the configuration of the organic electroluminescence device having an input function according to the first aspect of the invention described above, a touch panel configuration conforming to a capacitive sensing scheme is combined with the configuration of an organic electroluminescence device. With such a configuration, it is possible to reduce the adverse effects of a noise exerted onto the functioning of a first detection electrode and a second detection electrode. Therefore, it is possible to improve the accuracy in the detection of a touch panel user input. In addition, the organic electroluminescence device having an input function according to the first aspect of the invention described above is provided with the first detection electrode and the second detection electrode having detection axes orthogonal to each other. With such a configuration, it is possible to make a positional detection that is fully responsive to a touch contact input made along, for example, both the X direction and the Y direction. Therefore, it is possible to improve the reliability of touch panel contact detection. Thus, the organic electroluminescence device having an input function according to the first aspect of the invention described above ensures a high precision in the detection of a touch panel user input, thereby making it possible to offer a reliable touch-sensitive apparatus that features greater performance.

In the configuration of the organic electroluminescence device having an input function according to the first aspect of the invention described above, it is preferable that the first detection electrode should be configured as a part of a light-shielding film that is formed at the inner-surface side of the sealing substrate.

With such a configuration, since it is not necessary to provide another separate light-shielding film in addition to the first detection electrode, it is possible to reduce the thickness of the sealing substrate. Moreover, if the light-shielding film is configured to demarcate (i.e., partition, or define the boundary of) a plurality of sub pixel regions, the light-shielding film prevents the occurrence of undesirable color mixture between sub pixel regions that are arrayed adjacent to one another. In the configuration of the organic electroluminescence device having an input function described above, it is preferable that another part of the light-shielding film that does not constitute the first detection electrode should have a fixed potential. With such a configuration, the above-mentioned another part of the light-shielding film that does not constitute the first detection electrode, which has a certain fixed potential, functions as a shield electrode for blocking an electric field component that is generated slightly between a pair of electrodes that sandwiches the light-emitting layer. By this means, it is possible to reduce the adverse effects of a noise that is attributable to such an electric field component with an increased reliability.

In the configuration of the organic electroluminescence device having an input function according to the first aspect of the invention described above, it is preferable that the pair of electrodes should be made up of a positive electrode and a negative electrode; and the negative electrode should be formed in a planar pattern on the element substrate. With such a configuration, the negative electrode functions as a shield electrode for blocking an electric field component that is generated slightly between a pair of electrodes that sandwiches the light-emitting layer. Thus, it is possible to prevent the precision in the contact detection of a touch panel user input from being lowered because of an electric field component noise, thereby ensuring a reliable performance thereof.

In order to address the above-identified problem without any limitation thereto, the invention provides, as a second aspect thereof, an electronic apparatus that is provided with the above-described organic electroluminescence device having an input function.

Since the electronic apparatus according to the second aspect of the invention is provided with, for example as its display unit, the organic electroluminescence device having an input function that is capable of making a touch panel contact detection with an enhanced detection accuracy, the electronic apparatus features greater performance in the detection of a touch panel user input with an increased reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
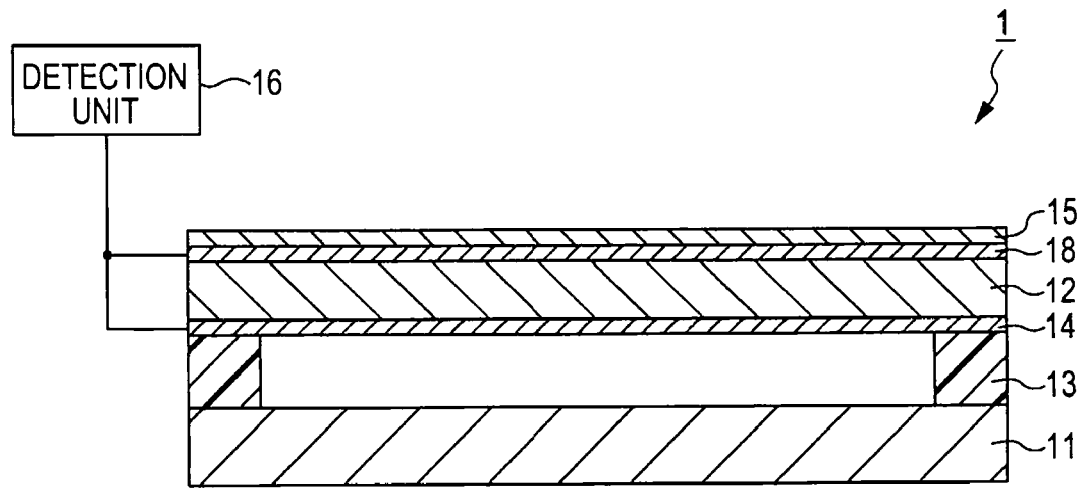
FIG. 1 is a sectional view that schematically illustrates an example of the configuration of an organic electroluminescence device having an input function according to a first exemplary embodiment of the invention.
Figure 2:
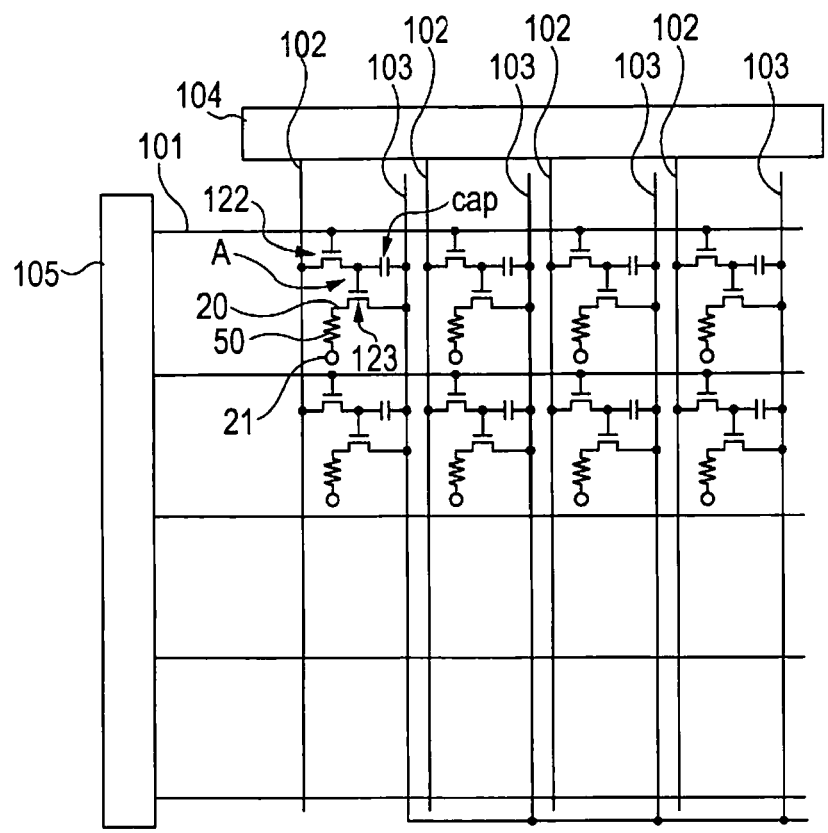
FIG. 2 is an equivalent circuit diagram that illustrates an example of the organic electroluminescence device having an input function according to the first exemplary embodiment of the invention.
Figure 3:
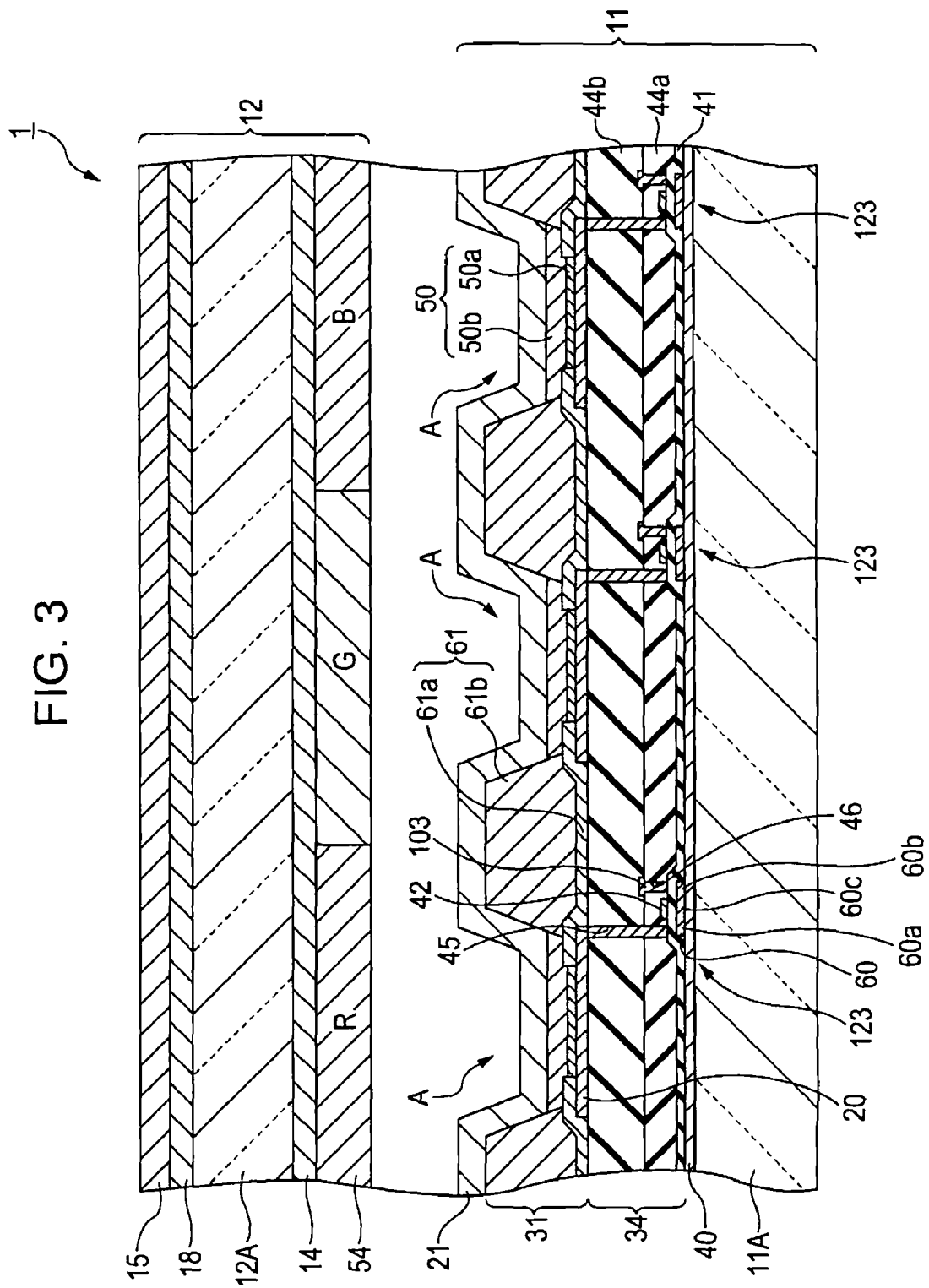
FIG. 3 is a sectional view that schematically illustrates an example of the configuration of an image display area of the organic electroluminescence device having an input function according to the first exemplary embodiment of the invention.

With reference to the accompanying drawings, an organic electroluminescence device having an input function according to a first exemplary embodiment of the present invention is described below. In the following description, for convenience of explanation, an "organic electroluminescence device having an input function" may be simply referred to as "organic EL device having an input function" or "touch-sensitive organic EL device", where the term "touch-sensitive" is a non-limiting paraphrasing of "having an input function", if the context allows. It should be noted that different scales are used for members illustrated in each of the accompanying drawings that are referred to in the following explanation so that each of the members illustrated therein has a size that is easily recognizable. FIG. 1 is a sectional view that schematically illustrates an example of the configuration of a touch-sensitive organic EL device (an organic electroluminescence device having an input function) according to a first exemplary embodiment of the invention. FIG. 2 is an equivalent circuit diagram that illustrates an example of the touch-sensitive organic EL device according to the first exemplary embodiment of the invention. FIG. 3 is a sectional view that schematically illustrates an example of the configuration of an image display area of the touch-sensitive organic EL device according to the first exemplary embodiment of the invention. In the configuration of an organic EL device having an input function according to the first exemplary embodiment of the invention, a set of three sub pixel regions constitutes one pixel. Each one of these three sub pixel regions contributes to the outputting of the corresponding one of three primary color components, that is, red (R), green (G), and blue (B). The sub pixel region is defined as the minimum unit of a display region for image display.

First of all, in the following description, an explanation is given of the general configuration of an organic EL device 1 having an input function according to the first exemplary embodiment of the invention. As illustrated in FIG. 1, the organic EL device 1 having an input function according to the first exemplary embodiment of the invention is provided with an element substrate 11, which is an active matrix substrate, and a counter sealing substrate 12 that is opposed to (i.e., provided in opposition to) the element substrate 11. The organic EL device 1 having an input function according to the first exemplary embodiment of the invention is configured as a so-called top-emission type display device. That is, light emitted from a light-emitting layer formed on (i.e., in) the element substrate 11 of the top-emission type organic EL device 1 goes out through the counter sealing substrate 12 thereof.

In addition, the organic EL device 1 having an input function according to the first exemplary embodiment of the invention is further provided with a frame-shaped sealing resin 13. The sealing resin 13, which has a substantially quadrangular shape in a plan view, is provided at the peripheral region around a central region where the element substrate 11 and the counter sealing substrate 12 are opposed to each other. The sealing resin 13 attaches the element substrate 11 and the counter sealing substrate 12 to each other. The sealing resin 13 is made of a thermosetting resin, an ultraviolet (UV) curable resin, or the like. In particular, it is preferable that the sealing resin 13 should be made of an epoxy resin, which is a type of thermosetting resins. The sealing resin 13 is provided for the technical purpose of preventing a light-emitting layer, which is formed on a negative electrode or in a light emission element layer portion, from becoming oxidized. A getter material that absorbs water, oxygen, and the like may be provided inside the sealing resin 13 so as to soak up water or absorb oxygen that infiltrates into a sealing can. In the configuration of the organic EL device 1 having an input function according to the first exemplary embodiment of the invention, an image display region is formed at an area inside the sealing resin 13.

Further in addition, the organic EL device 1 having an input function according to the first exemplary embodiment of the invention is provided with a first detection electrode 14, a second detection electrode 18, a dielectric film 15, and a detection unit 16. The first detection electrode 14 is provided on the inner surface of the counter sealing substrate 12, or in other words, on one surface thereof that is opposed to (i.e., closer to) the element substrate 11. The second detection electrode 18 is provided on the outer surface of the counter sealing substrate 12, or in other words, on the other surface thereof that is opposite to the above-mentioned one surface that is opposed to the element substrate 11. The second detection electrode 18 has a detection axis that is not the same as that of the first detection electrode 14. The dielectric film is deposited on the (upper) surface of the second detection electrode 18. The detection unit 16 detects a position at which electrostatic capacitance is generated via the dielectric film 15 between the first detection electrode 14 and the second detection electrode 18 (generated via the dielectric film 15 between the first detection electrode 14, the second detection electrode 18, and a touching object). A combination of the first detection electrode 14, the second detection electrode 18, the dielectric film 15, and the detection unit 16 constitutes a so-called a touch panel unit that operates in compliance with the so-called capacitive sensing scheme.

As illustrated in FIG. 2, the organic EL device 1 having an input function according to the first exemplary embodiment of the invention has a plurality of scanning lines 101, and a plurality of signal lines 102 each of which extends in a direction orthogonal to a direction in which each of the plurality of scanning lines 101 extends. The organic EL device 1 having an input function according to the first exemplary embodiment of the invention further has a plurality of power lines 103, each of which extends in parallel with the corresponding one of the plurality of signal lines 102. A sub pixel region A is provided at a position corresponding to each one of a plurality of intersections formed by the plurality of scanning lines 101 and the plurality of signal lines 102 extending perpendicular to each other.

A data-line-side driving circuit 104, which is provided with a shift register, a level shifter, a video line, and an analog switch, is connected to each of the signal lines 102. On the other hand, a scanning-line-side driving circuit 105, which is provided with a shift register and a level shifter, is connected to each of the scanning lines 101. In addition, in each of the sub pixel regions A, a switching thin film transistor 122, a hold capacitor (i.e., retention volume) "cap" (hereafter referred to as cap, that is, without a double quotation mark), a driving thin film transistor 123, a pixel electrode (i.e., positive electrode) 20, and an organic EL layer 50 are formed. A scanning signal is supplied from the scanning line 101 to the gate electrode of the switching thin film transistor 122. A pixel signal is supplied from the signal line 102 to the hold capacitor cap via the switching thin film transistor 122. The hold capacitor cap retains the pixel signal supplied thereto. The pixel signal retained at the hold capacitor cap is then supplied to the gate electrode of the driving thin film transistor 123. A driving electric current flows from the power line 103 into the pixel electrode 20 when the pixel electrode 20 is electrically connected to the power line 103 via the driving thin film transistor 123. The organic EL layer 50 is sandwiched between the pixel electrode 20 and a counter electrode (i.e., opposite electrode, negative electrode) 21. A combination of the pixel electrode 20, the counter electrode 21, and the organic EL layer 50 constitutes a light emission element.

When the scanning line 101 is activated (i.e., driven) so as to turn the switching thin film transistor 122 into an ON state, the potential of the signal line 102 at the time thereof is retained at the hold capacitor cap. Depending on the current (i.e., present) state of the hold capacitor cap, the ON/OFF state of the driving thin film transistor 123 is determined. Then, an electric current flows from the power line 103 into the pixel electrode 20 via the channel region of the driving thin film transistor 123. Subsequently, the electric current flows through the organic EL layer 50 into the counter electrode 21. The organic EL layer 50 emits light depending on the amount of an electric current that flows therethrough.

Next, with reference to FIG. 3, the detailed layer structure of the organic EL device 1 having an input function according to the first exemplary embodiment of the invention is explained below. It should be noted that the sectional view of the organic EL device 1 having an input function according to the first exemplary embodiment of the invention illustrated in FIG. 3 shows a layer portion corresponding to three sub pixel regions A. The element substrate 11 has a base substrate substance 11A as its underlying substrate body. The base substrate substance 11A of the element substrate 11 is made of a transparent substrate such as a glass substrate, though not limited thereto. The element substrate 11 has a circuit element layer portion 34, a light emission element layer portion 31, and the counter electrode 21, which are laminated one on another on the base substrate substance 11A in the order of appearance herein. The circuit element layer portion 34 includes various kinds of circuits such as thin film transistors (TFT). The light emission element layer portion 31 includes the organic EL layer 50. With such a configuration, light emitted from the organic EL layer 50 transmits through the counter electrode 21 to go out from the counter sealing substrate 12, or in other words, at an observer side. The counter electrode 21 is formed as a "solid electrode" on the light emission element layer portion 31 in such a manner that it covers the entire area of the sub pixel regions A. As a material of the counter electrode 21, a transparent material such as indium tin oxide (ITO), Pt, Ir, Ni, Pd, or the like is used.

It should be noted that the counter electrode 21 may be configured to have a laminated layer structure. When so configured, it is preferable that the ground layer of the counter electrode 21 that is closer or closest to the light-emitting layer should have a lower or the lowest work function. Especially, in the present embodiment of the invention, the counter electrode 21 is deposited to be directly in contact with a light-emitting layer 50b of the organic EL layer 50 so as to inject an electron into the light-emitting layer 50b.

The circuit element layer portion 34 has an underlying protection film 40, which is deposited on the base substrate substance 11A. The underlying protection film 40 is made of a silicon oxide film. An island-pattern semiconductor film 60, which is made of polycrystalline silicon, is formed on the underlying protection film 40. The semiconductor film 60 has a source region 60a and a drain region 60b. The source region 60a and the drain region 60b of the semiconductor film 60 are formed by means of a highly doped phosphorus ion implantation technique. The remaining portion at which the highly doped phosphorus ion is not implanted constitutes a channel region 60c of the semiconductor film 60.

A transparent gate insulation film 41 is deposited to cover both of the underlying protection film 40 and the semiconductor film 60. A gate electrode 42 (i.e., scanning line 101) is formed on the gate insulation film 41 for each semiconductor 60. The gate electrode 42 is made of Al, Mo, Ta, Ti, or W, though not limited thereto. A transparent first inter-bedded insulation film 44a is deposited to cover both the gate electrode 42 and the gate insulation film 41. A transparent second inter-bedded insulation film 44b is deposited on the first inter-bedded insulation film 44a. The gate electrode (Each of the gate electrodes) 42 is provided at a position overlying the channel region 60c of the semiconductor film 60 (the corresponding one of the channel regions 60c of the semiconductor films 60). A contact hole (Each of contact holes) 45 is formed to penetrate through the second inter-bedded insulation film 44b and the first inter-bedded insulation film 44a. The contact hole 45 provides an electric connection to the source region 60a of the semiconductor film 60. On the other hand, a contact hole (Each of contact holes) 46 is formed to penetrate through the first inter-bedded insulation film 44a. The contact hole 46 provides an electric connection to the drain region 60b of the semiconductor film 60.

The pixel electrode (Each of the pixel electrodes) 20, which is made of a transparent material such as an indium tin oxide (ITO) or the like, is formed in a predetermined pattern on the second inter-bedded insulation film 44b. One of two contact holes mentioned above, that is, the contact hole 45, is electrically connected to the pixel electrode 20. The other of two contact holes mentioned above, that is, the contact hole 46, is electrically connected to the power line 103. With the configuration described above, a plurality of the driving thin film transistors 123 each of which is electrically connected to the corresponding one of the pixel electrodes 20 is formed in the circuit element layer portion 34.

The light emission element layer portion 31 has, as its main components, the organic EL layers 50 and bank portions 61. Each of the organic EL layers 50 is deposited on the corresponding one of the plurality of pixel electrodes 20. Each of the bank portions 61 is interposed between one set of the pixel electrode 20 and the organic EL layer 50 and another set of the pixel electrode 20 and the organic EL layer 50 that are horizontally adjacent to each other so as to isolate and partition one organic EL layer 50 from another (i.e., adjacent one) organic EL layer 50. The counter electrode 21 is deposited on the organic EL layers 50. A combination of the pixel electrode 20, the organic EL layer 50, and the counter electrode 21 constitutes a light-emitting element. Each of the pixel electrodes 20 is made of ITO or the like. Each of the pixel electrodes 20 is formed in a rectangular pattern in a plan view. Each of the bank portions 61 is formed to isolate and partition one pixel electrode 20 from another pixel electrode 20 that are adjacent to each other.

As illustrated in FIG. 3, each of the bank portions 61 is made up of a lamination of an inorganic bank layer 61a and an organic bank layer 61b. The inorganic bank layer 61a is deposited as a lower first bank layer closer to the base substrate substance 11A. The organic bank layer 61b, which is an upper second bank layer, is deposited on the inorganic bank layer 61a. The inorganic bank layer 61a serves as a first partition portion. The organic bank layer 61b serves as a second partition portion. The inorganic bank layer 61a is made of, for example, $TiO_2$, $SiO_2$, or the like. The organic bank layer 61b is made of, for example, acrylic resin, polyimide resin, or the like.

Both of the inorganic bank layer 61a and the organic bank layer 61b of each of the bank portions 61 are configured to overlie the peripheral edge portion of the corresponding one of the pixel electrodes 20. In a plan view, the inorganic bank layer 61a partially overlaps the peripheral edge portion of the pixel electrode 20. The organic bank layer 61b also partially overlaps the peripheral edge portion of the pixel electrode 20 in a plan view. Each of two edges of the inorganic bank layer 61a lies at a position closer to the center of the corresponding one of the pixel electrodes 20 than the counterpart edge of the organic bank layer 61b. In other words, the edge of the inorganic bank layer 61a is protruded by a greater distance toward the center of the pixel electrode 20 in comparison with the edge of the organic bank layer 61b.

The organic EL layer 50 is made up of a (electron-) hole-injection/hole-transportation layer 50a and the light-emitting layer 50b. The hole-injection/hole-transportation layer 50a is deposited on the pixel electrode 20. The light-emitting layer 50b is deposited on the hole-injection/hole-transportation layer 50a. The hole-injection/hole-transportation layer 50a has a function of injecting an electron hole into the light-emitting layer 50b. In addition to the hole-injection function described above, the hole-injection/hole-transportation layer 50a has another function of transporting an electron hole inside the hole-injection/hole-transportation layer 50a itself. Thanks to the hole-injection/hole-transportation layer 50a that is interposed between the pixel electrode 20 and the light-emitting layer 50b, it is possible to enhance the element characteristic (i.e., device characteristic) of the light-emitting layer 50b such as light emission efficiency, service life, though not limited thereto. A hole injected from the hole-injection/hole-transportation layer 50a and an electron injected from the counter electrode 21 are re-coupled in the light-emitting layer 50b. By this means, the light-emitting layer 50b performs the emission of light. As a material of the hole-injection/hole-transportation layer 50a, for example, a mixture of polythiophene derivative such as polyethylene dioxythiophene or the like and polystyrene sulphonic acid or the like may be used. Since the organic EL device 1 having an input function according to the present embodiment of the invention is configured as a top-emission type device, a reflective film is formed on the lower surface of the light-emitting layer 50b. The reflective film that is not shown in the drawing makes it possible to obtain an optical output in an efficient manner.

Each of the light-emitting layers 50b, which is configured to cover the corresponding one of the hole-injection/hole-transportation layers 50a, is deposited between the corresponding two adjacent ones of the organic bank layers 61b. The thickness of the light-emitting layer 50b is within a range of 50-80 nm. The light-emitting layer 50b contains three color types of light emission materials including a red light emission material that is capable of emitting red color light, a green light emission material that is capable of emitting green color light, and a blue light emission material that is capable of emitting blue color light. Having such three primary color types of light emission materials, the light-emitting layer 50b is configured to emit white light. The light-emitting layer 50b is a common layer in the sub pixel regions A. That is, in the configuration of the organic EL device 1 having an input function according to the present embodiment of the invention, white light that is emitted from the light-emitting layer 50b is colored when it transmits through a color filter layer 54 that is provided in the counter sealing substrate 12 for color display. A more detailed explanation of the configuration of the color filter 54 is given later.

As the light-emitting material of a light-emitting layer, a known substance that is capable of emitting fluorescent light or phosphorescent light may be used. Specifically, it is preferable to use a poly silane system substance such as (poly) fluorene derivative (PF), (poly) paraphenylene vinylene derivative (PPV), polyphenylene derivative (PP), polyparaphenylene derivative (PPP), polyvinyl carbazole (PVK), polythiophene derivative, poly methyl phenyl silane (PMPS), though not limited thereto, as the light-emitting material of a light-emitting layer. Or, another high polymeric material such as perylene pigment, coumarin pigment, rhodamine pigment or the like may be doped with the high polymeric material enumerated above as the light-emitting material of a light-emitting layer. Alternatively, a low polymeric material such as rubrene, perylene, 9,10-diphenylanthracene, tetraphenylbutadiene, nile red, coumarin-6, quinacridon, or the like may be doped with the high polymeric material enumerated above as the light-emitting material of a light-emitting layer. As another alternative example, the low polymeric material enumerated above may be doped with another low polymeric material such as carbazole (CBP) or the like to constitute the light-emitting material of a light-emitting layer. In addition, tris 8-quinolinolato aluminum complex ($Alq_3$) may be added as the electron-transportation-layer part of a light-emitting layer.

The sealing substrate 12 has a base substrate substance 12A as its main substrate body. The base substrate substance 12A of the sealing substrate 12 is made of a transparent material such as a glass, quartz, plastic, or the like. The first detection electrode 14 is formed on the inner surface of the base substrate substance 12A (i.e., surface opposed to the element substrate 11). The aforementioned color filter layer 54 is formed on the first detection electrode 14. On the other hand, the second detection electrode 18 is provided on the outer surface of the base substrate substance 12A of the sealing substrate 12. Each of the first detection electrode 14 and the second detection electrode 18 is configured as a uniform layer made of a transparent electro-conductive material such as ITO or the like.

The color filter layer 54, which is formed indirectly on the inner surface of the base substrate substance 12A, has, for example, acrylic colorants corresponding to primary colors displayed in the sub pixel regions, though not limited to acrylic ones. With such a configuration, the color filter layer 54 colors incoming white light into red (R) light, green (G) light, and blue (B) light.

Figure 4A:
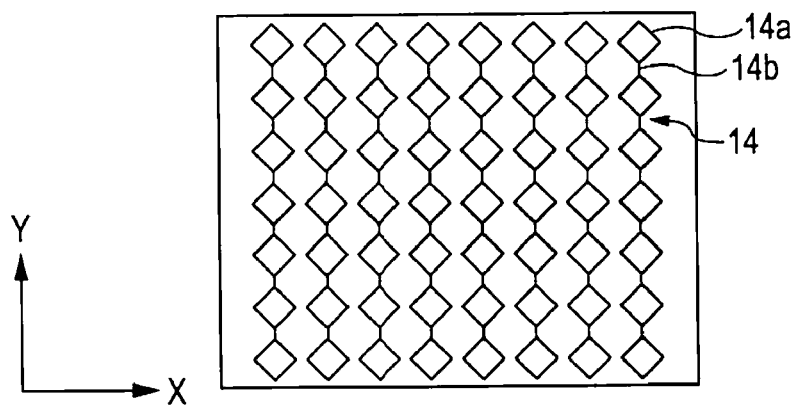
FIG. 4A is a plan view that schematically illustrates an example of the layout of a first detection electrode.
Figure 4B:
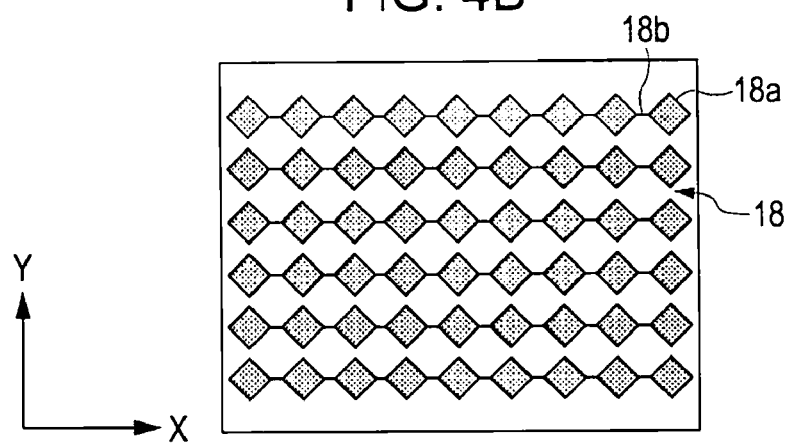
FIG. 4B is a plan view that schematically illustrates an example of the layout of a second detection electrode.
Figure 4C:
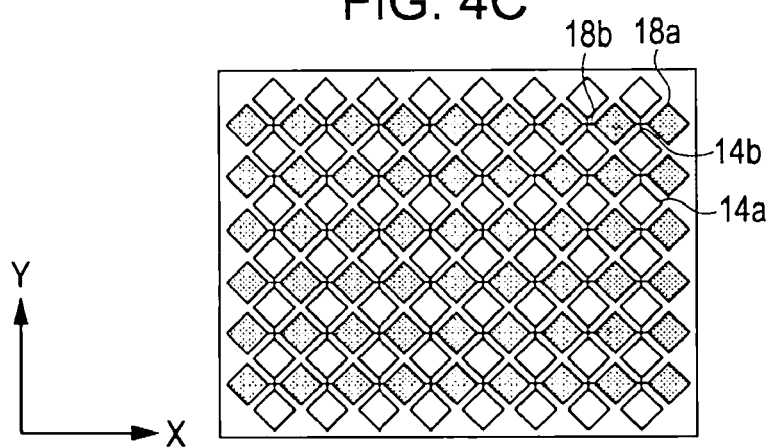
FIG. 4C is a superposed layout plan view that schematically illustrates the relative array patterns of the first detection electrode and the second detection electrode.

FIG. 4A is a plan view that schematically illustrates an example of the layout of the first detection electrode 14, which is viewed from the inner-surface side of the base substrate substance 12A of the sealing substrate 12. FIG. 4B is a plan view that schematically illustrates an example of the layout of the second detection electrode 18, which is viewed from the outer-surface side of the base substrate substance 12A of the sealing substrate 12. FIG. 4C is a "superposed layout" plan view that schematically illustrates the relative array patterns of the first detection electrode 14 and the second detection electrode 18.

As illustrated in FIG. 4A, the first detection electrode 14 has a plurality of rhomboid-shaped (i.e., diamond-shaped) pad portions 14a that are arrayed in a plurality of lines each of which extends in the Y direction (hereafter referred to as longitudinal direction) with an equal interval allocated each between two adjacent ones of the plurality of pad lines. Each two Y-adjacent ones of the diamond-shaped pad portions 14a is connected to each other via a line portion 14b interposed therebetween in such a manner that these pad portions 14a and the line portions 14b constitute a plurality of longitudinal stripes. One end of the longitudinal stripe of the first detection electrode 14 is connected to the detection unit 16, which is not illustrated in FIG. 4A. In other words, the first detection electrode 14 has its detection axis extending in the Y direction.

On the other hand, as illustrated in FIG. 4B, the second detection electrode 18 has a plurality of rhomboid-shaped pad portions 18a that are arrayed in a plurality of lines each of which extends in the X direction (hereafter referred to as latitudinal direction) with an equal interval allocated each between two adjacent ones of the plurality of pad lines. Each two X-adjacent ones of the diamond-shaped pad portions 18a is connected to each other via a line portion 18b interposed therebetween in such a manner that these pad portions 18a and the line portions 18b constitute a plurality of latitudinal stripes. One end of the latitudinal stripe of the second detection electrode 18 is connected to the detection unit 16, which is not illustrated in FIG. 4B. In other words, the second detection electrode 18 has its detection axis extending in the X direction.

That is, in the configuration of the organic EL device 1 having an input function according to the present embodiment of the invention, the detection axis of the first detection electrode 14 and the detection axis of the second detection electrode 18 are orthogonal to each other. Specifically, in the configuration of the organic EL device 1 having an input function according to the present embodiment of the invention, as illustrated in FIG. 4C, the first detection electrode 14 and the second detection electrode 18 are arrayed with the base substrate substance 12A of the sealing substrate 12 being sandwiched therebetween in such a manner that the extending direction of the line portions 14b of the first detection electrode 14 and the extending direction of the line portions 18b of the second detection electrode 18 are orthogonal to each other. In addition thereto, the first detection electrode 14 and the second detection electrode 18 are superposed with each other in such a manner that the pad portions 14a of the first detection electrode 14 and the pad portions 18a of the second detection electrode 18 are arrayed in a staggered pattern, which means that the former and the latter do not overlap with each other in a plan view. With such a layout pattern, it is possible to maximize the area covered by the pad portions 14a of the first detection electrode 14 and the pad portions 18a of the second detection electrode 18 formed on the base substrate substance 12A of the sealing substrate 12. As a result thereof, advantageously, it is possible to maximize the effective contact position detection area of the aforementioned touch panel unit. In addition, in the configuration of the first detection electrode 14 and the second detection electrode 18 that are arrayed to have the detection axes orthogonal to each other, the line portion 14b/18b has a smaller surface area in comparison with that of the pad portion 14a/18b. Therefore, it is possible to reduce an undesirable capacitance that is generated between the first detection electrode 14 and the second detection electrode 18. At the end portion of each of the first detection electrode 14 and the second detection electrode 18, terminals to which a detection signal is supplied from the detection unit 16 are provided. It should be noted that these terminals are not illustrated in the drawing.

The detection unit 16 applies an alternating voltage to the terminals provided on the first detection electrode 14 and the terminals provided on the second detection electrode 18, where the alternating voltage applied to one terminal has the same phase and the same potential as that applied to other terminals. Accordingly, a uniform electric field is generated on the inner surface of the first detection electrode 14 and on the inner surface of the second detection electrode 18. The detection unit 16 is configured to detect a contact position at which a touching object such as a finger or the like is placed on the basis of the measurement value of the amount of an electric current that flows by means of an electrostatic capacitance, which is generated via the dielectric film 15 between the first detection electrode 14, the second detection electrode 18, and the touching object. As an example of a modified configuration, a circular polarization sheet that is made of a dielectric material such as a polyvinyl alcohol (PVA) or the like and functions as an antireflection film may be used in place of the dielectric film 15.

Operation of Organic EL Device Having Input Function

Next, an explanation is given below of the operation of the organic EL device 1 having an input function according to the first exemplary embodiment of the invention described above. When a voltage is applied between the pixel electrode 20 and the counter electrode 21, a hole is injected from the pixel electrode 20 into the light-emitting layer 50b through the hole-injection/hole-transportation layer 50a. In addition, upon application of a voltage between the pixel electrode 20 and the counter electrode 21, an electron is injected from the counter electrode 21 into the light-emitting layer 50b. Then, the hole injected from the pixel electrode 20 through the hole-injection/hole-transportation layer 50a and the electron injected from the counter electrode 21 are re-coupled in the light-emitting layer 50b. Due to energy generated at the time of the re-coupling of the hole and the electron, peripheral molecules inside the light-emitting layer 50b become excited. A differential energy that is generated at the time when the excited molecules get deactivated from the excitation state into the ground state is emitted in the form of light. By this means, it is possible to display a desired image.

As the fruits of devoted and committed efforts made by the inventors who have conceived the technical idea of the present invention, it is found that an organic electroluminescence (EL) device is less susceptible to a noise that is attributable to an electric field component generated by a driving signal that is applied between a pair of a pixel electrode and a counter electrode. That is, the inventors of the subject application have reached technical findings that, since a pair of a pixel electrode and a counter electrode that sandwiches an organic EL layer is formed at the element-substrate (11) side only in the configuration of an organic EL device, a counter sealing substrate of the organic EL device that is opposed to the element substrate thereof is relatively free from an electric field noise. As a consequence thereof, the inventors of the subject application have arrived at the idea of providing a touch panel unit on the sealing-substrate (12) side of the organic EL device that is less susceptible to an electric field noise. In this way, the inventors of the subject application have conceived the novel and inventive configuration of the organic EL device 1 having an input function according to the first exemplary embodiment of the invention described above.

In the configuration of the organic EL device 1 having an input function according to the first exemplary embodiment of the invention described above, the counter electrode (i.e., negative electrode) 21 is formed in a planar pattern on the element substrate 11. With such a configuration, the counter electrode 21 functions as a shield electrode. Since the counter electrode 21 functions as a shield electrode, it is possible to prevent the detection accuracy of a touch-panel user input from being lowered due to an electric field component noise that is generated slightly between the pixel electrode 20 and the counter electrode 21 at the time of light emission. The improved detection accuracy featured by the organic EL device 1 having an input function according to the first exemplary embodiment of the invention described above ensures high performance and high reliability.

When a user makes a touch panel input, they touch the surface of a touch-sensitive panel provided in the sealing substrate 12 with their finger(s). When a touching object such as a finger or the like becomes in contact with the dielectric film 15 under an operation state where a uniform alternating voltage is applied onto each of the inner surfaces of the first detection electrode 14 and the second detection electrode 18, electrostatic capacitance is generated between the first detection electrode 14, the second detection electrode 18, and the touching object with the dielectric film 15 being interposed therebetween. As the electrostatic capacitance is generated between the first detection electrode 14, the second detection electrode 18, and the touching object, an electric current flows from each of the terminals provided on the first detection electrode 14 and the second detection electrode 18 by means of the generated electrostatic capacitance. Then, at each electrode terminal, the detection unit 16 detects, that is, measures, the amount of an electric current that flows as the electrostatic capacitance is generated. On the basis of the measured electric current amount, the detection unit 16 detects the contact position of the touching object such as a finger. The configuration for making such detection is illustrated in FIG. 1 explained above. As has already been described above, the organic EL device 1 having an input function according to the first exemplary embodiment of the invention supports two detection directions that are orthogonal to each other, that is, the X direction and the Y direction. With such a configuration, the organic EL device 1 having an input function according to the first exemplary embodiment of the invention can make a reliable touch detection no matter where a touching object such as a finger contacts the touch-sensitive surface (i.e., dielectric film 15) thereof. In addition, the organic EL device 1 having an input function according to the first exemplary embodiment of the invention is, as has already been described above, less vulnerable to the adverse effects of a noise attributable to an electric field component that is generated between the pixel electrode 20 and the counter electrode 21. Thus, the organic EL device 1 having an input function according to the first exemplary embodiment of the invention makes it possible to ensure a high precision in the detection of a touch position.

As described above, in the configuration of the organic EL device 1 having an input function according to the first exemplary embodiment of the invention, a touch panel configuration conforming to the capacitive sensing scheme is combined with the configuration of an organic EL device. With such a configuration, it is possible to reduce the adverse effects of a noise exerted onto the functioning of a first detection electrode (14) and a second detection electrode (18). Therefore, it is possible to improve the accuracy in the detection of a touch panel user input. In addition, the organic EL device 1 having an input function according to the first exemplary embodiment of the invention is provided with the first detection electrode 14 and the second detection electrode 18 having detection axes orthogonal to each other. With such a configuration, it is possible to make a positional detection that is fully responsive to a touch contact input made along both the X direction and the Y direction. Therefore, it is possible to improve the reliability of touch panel contact detection. Thus, the organic EL device 1 having an input function according to the first exemplary embodiment of the invention ensures a high precision in the detection of a touch panel user input, thereby making it possible to offer a reliable touch-sensitive apparatus that features greater performance.

Second Embodiment

Figure 5:
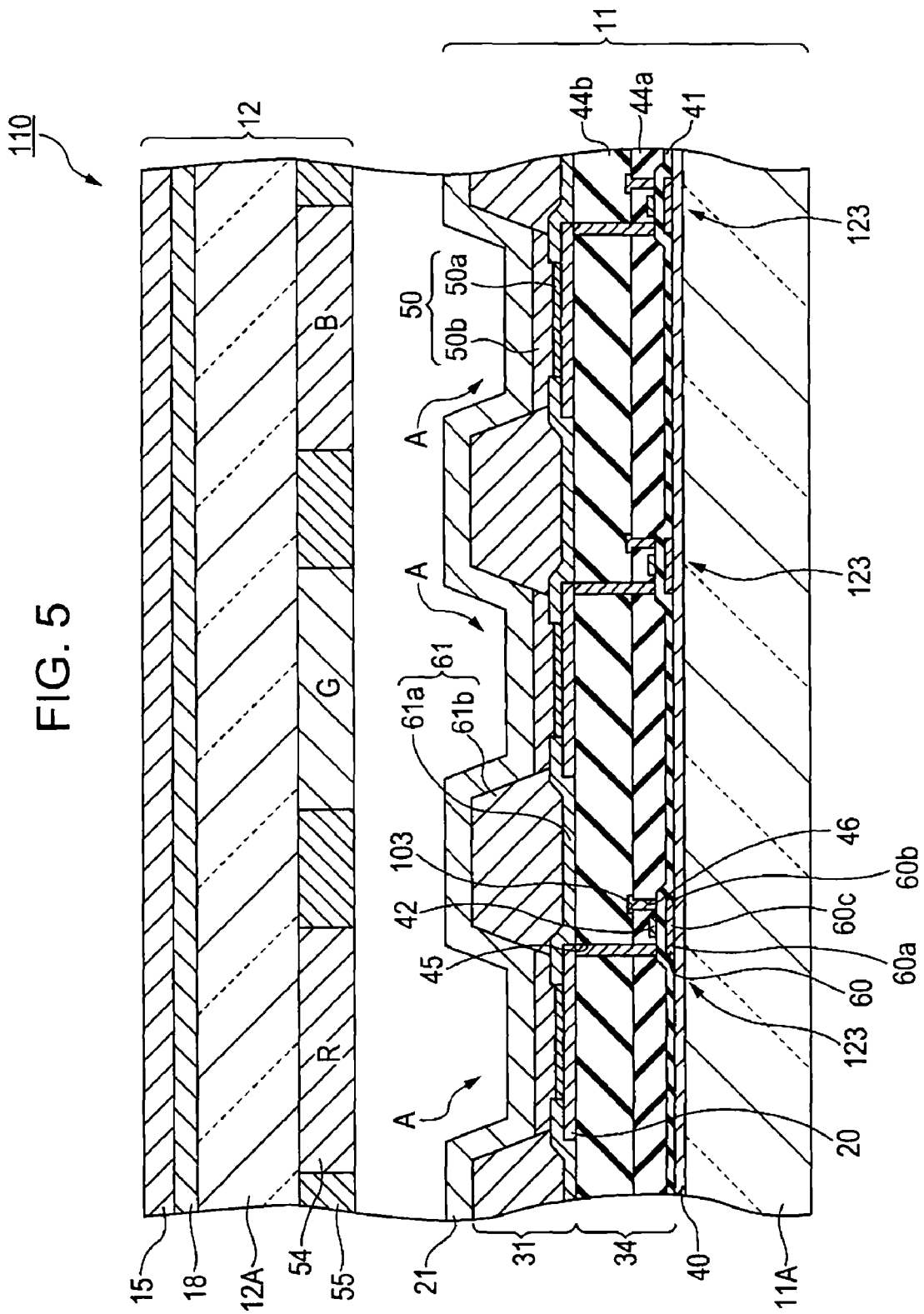
FIG. 5 is a sectional view that schematically illustrates an example of the configuration of an organic electroluminescence device having an input function according to a second exemplary embodiment of the invention.

Next, with reference to the accompanying drawings, an organic EL device having an input function according to a second exemplary embodiment of the invention is explained below. FIG. 5 is a sectional view that schematically illustrates the layer configuration of sub pixel regions. An organic EL device having an input function according to the present embodiment of the invention differs from the organic EL device 1 having an input function according to the first exemplary embodiment of the invention described above only in terms of the configuration of a first detection electrode. That is, except for the first detection electrode, an organic EL device having an input function according to the present embodiment of the invention has the same configuration as that of the organic EL device 1 having an input function according to the first exemplary embodiment of the invention. Accordingly, in the following description, an explanation is given with a focus on the differentiating and characteristic feature of the configuration of the first detection electrode. It should be noted that the same reference numerals are assigned to the same components as those of the touch-sensitive organic EL device 1 according to the first exemplary embodiment of the invention; and a detailed explanation thereof is omitted, or an explanation is simplified as long as the understanding of the unique feature of the invention is not impaired.

As illustrated in FIG. 5, in the configuration of an organic EL device 110 having an input function according to the present embodiment of the invention, the color filter layer 54 has a light-shielding portion 55, which functions as a light-shielding layer that shuts off light. The light-shielding portion 55, which is made of an electro-conductive material, doubles as the first detection electrode described above. The light-shielding portion 55 is made of a light-absorbing electrical conducting material. As a non-limiting example thereof, the light-shielding portion 55 is made of a light-absorbing metal material such as chromium (Cr) or a light-absorbing resin material with carbon black being dispersed therein.

Figure 6:
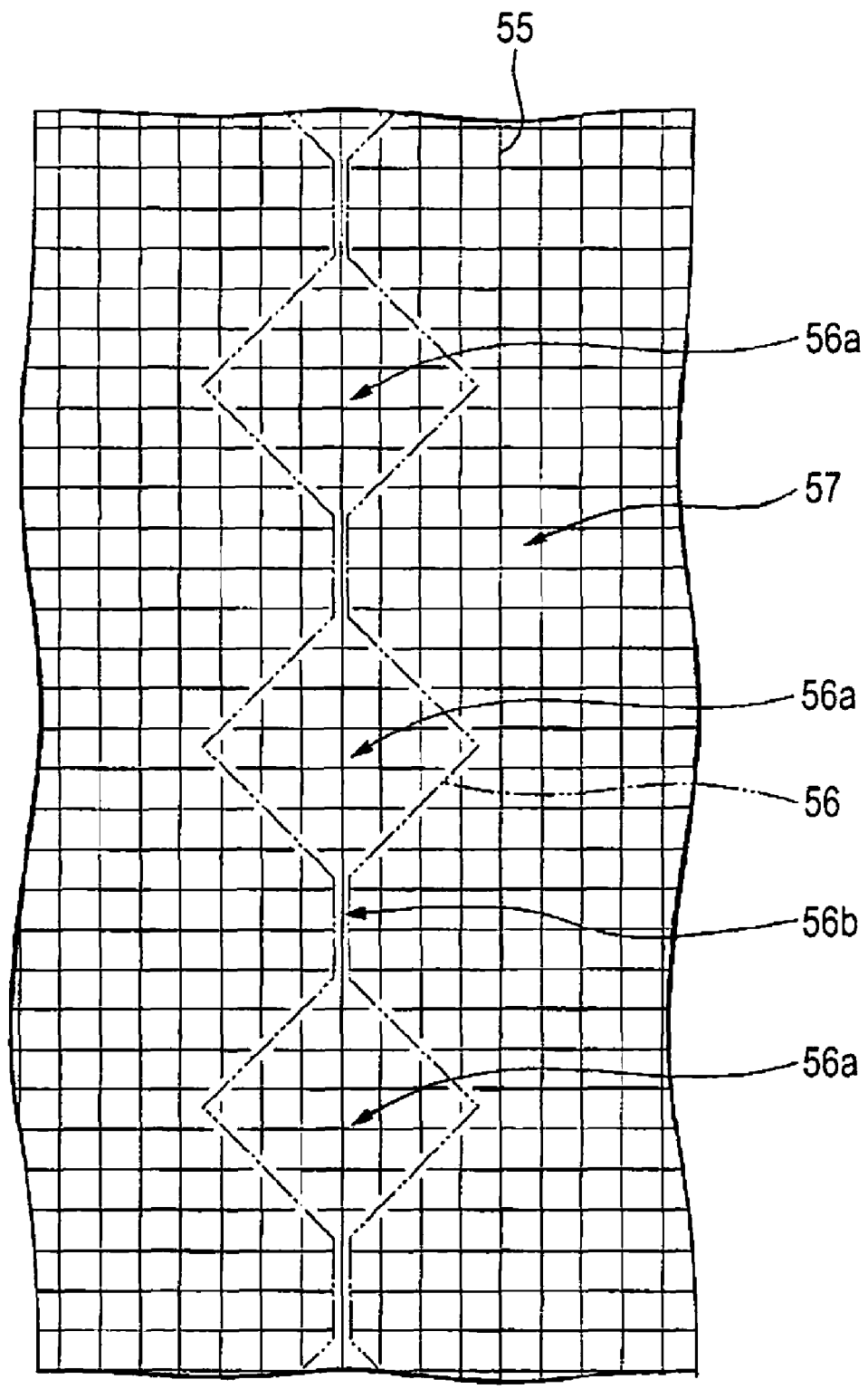
FIG. 6 is a plan view that schematically illustrates an example of the configuration of a light-shielding portion.

FIG. 6 is a plan view that schematically illustrates an example of the configuration of the light-shielding portion 55, which is viewed from the inner-surface side of the base substrate substance 12A that constitutes a part of the sealing substrate 12. As illustrated in FIG. 6, the light-shielding portion 55 is configured to have a grid array pattern in a plan view. Each unit region demarcated by a grid corresponds to the sub pixel region A described above.

The detecting region of the light-shielding portion 55 that functions as the first detection electrode describe above is isolated from the remaining non-detecting grid region thereof. That is, it is only some partial region of the light-shielding portion 55 that functions as the first detection electrode described above. Specifically, the light-shielding portion 55 is made up of a detection-electrode functional portion 56, which functions as the first detection electrode described above, and a light-shielding functional portion 57, which does not function as the first detection electrode described above but functions merely as a light-shielding film.

As illustrated in FIG. 6, the detection-electrode functional portion 56 of the light-shielding portion 55, which is shown by alternate long and two short dashes lines, has rhomboid-shaped portions 56a and conductive portions 56b. Each of the rhomboid-pattern portions 56a has the shape of a diamond that is "cut" out of a plurality of grid units in a plan view. Each of the conductive portions 56b is provided between two adjacent ones of the rhomboid-shaped portions 56a. The conductive portion 56b functions to electrically connect one rhomboid-shaped portion 56a and another rhomboid-shaped portion 56b adjacent to each other. The rhomboid-shaped portions 56a of the light-shielding portion 55 are arrayed in the Y direction as illustrated in the drawing. That is, an array of the rhomboid-shaped portions 56a (i.e., light-shielding portion 55) has its detection axis extending along the Y direction. It is preferable to set a gap distance between the detection-electrode functional portion 56 of the light-shielding portion 55 and the non-detecting light-shielding functional portion 57 thereof within a range of, approximately, 5-10 μm. In addition, it is preferable to set the diagonal length of the detection-electrode functional portion 56 of the light-shielding portion 55 within a range of, approximately, 3-5 mm.

The second detection electrode 18 is provided on the outer surface of the base substrate substance 12A that constitutes a part of the sealing substrate 12, which is the same as the configuration of the organic EL device 1 having an input function according to the first exemplary embodiment of the invention described above. Unlike the light-shielding film described above, the second detection electrode 18 is configured as a uniform layer that is made of a transparent electro-conductive material such as ITO or the like.

In the configuration of the organic EL device 110 having an input function according to the present embodiment of the invention, the detection-electrode functional portion 56 and the second detection electrode 18 are arrayed with the base substrate substance 12A of the sealing substrate 12 being sandwiched therebetween in such a manner that the rhomboid-shaped portions 56a of the detection-electrode functional portion 56 and the pad portions 18a of the second detection electrode 18 are arrayed in a staggered pattern, which means that the former and the latter do not overlap with each other in a plan view. The staggered electrode layout illustrated in FIG. 4C also applies to the configuration of the touch-sensitive organic EL device 110 according to the present embodiment of the invention. At the end of the detection-electrode functional portion 56 of the light-shielding portion 55, a terminal to which a detection signal is supplied from the detection unit 16 is provided. It should be noted that this terminal is not illustrated in the drawing. The non-detecting light-shielding functional portion 57 of the light-shielding portion 55 is electrically connected to a circuitry that is provided on the element substrate 11 via inter-substrate electroconductive terminals, which are provided on the edge region of the sealing substrate 12. The non-detecting light-shielding functional portion 57 is controlled to have a certain fixed electric potential (e.g., ground potential). With such a configuration, the non-detecting light-shielding functional portion 57 having a certain fixed electric potential functions as a shield electrode for blocking an electric field component that is generated slightly between a pair of the pixel electrode 20 and the counter electrode 21 that sandwiches the light-emitting layer 50b. By this means, it is possible to reduce the adverse effects of a noise that is attributable to such an electric field component with an increased reliability.

As explained above, the organic EL device 110 having an input function according to the present embodiment of the invention offers the same advantageous working effects that are achieved by the organic EL device 1 having an input function according to the first exemplary embodiment of the invention described above. In addition thereto, in the configuration of the touch-sensitive organic EL device 110 according to the present embodiment of the invention, a part of the light-shielding portion 55 also functions as the first detection electrode. Therefore, it is not necessary to provide another separate light-shielding film in addition thereto. By this means, it is possible to reduce the thickness of the sealing substrate 12. Moreover, the light-shielding film prevents the occurrence of undesirable color mixture between sub pixel regions A that are arrayed adjacent to one another.

Third Embodiment

Figure 7:
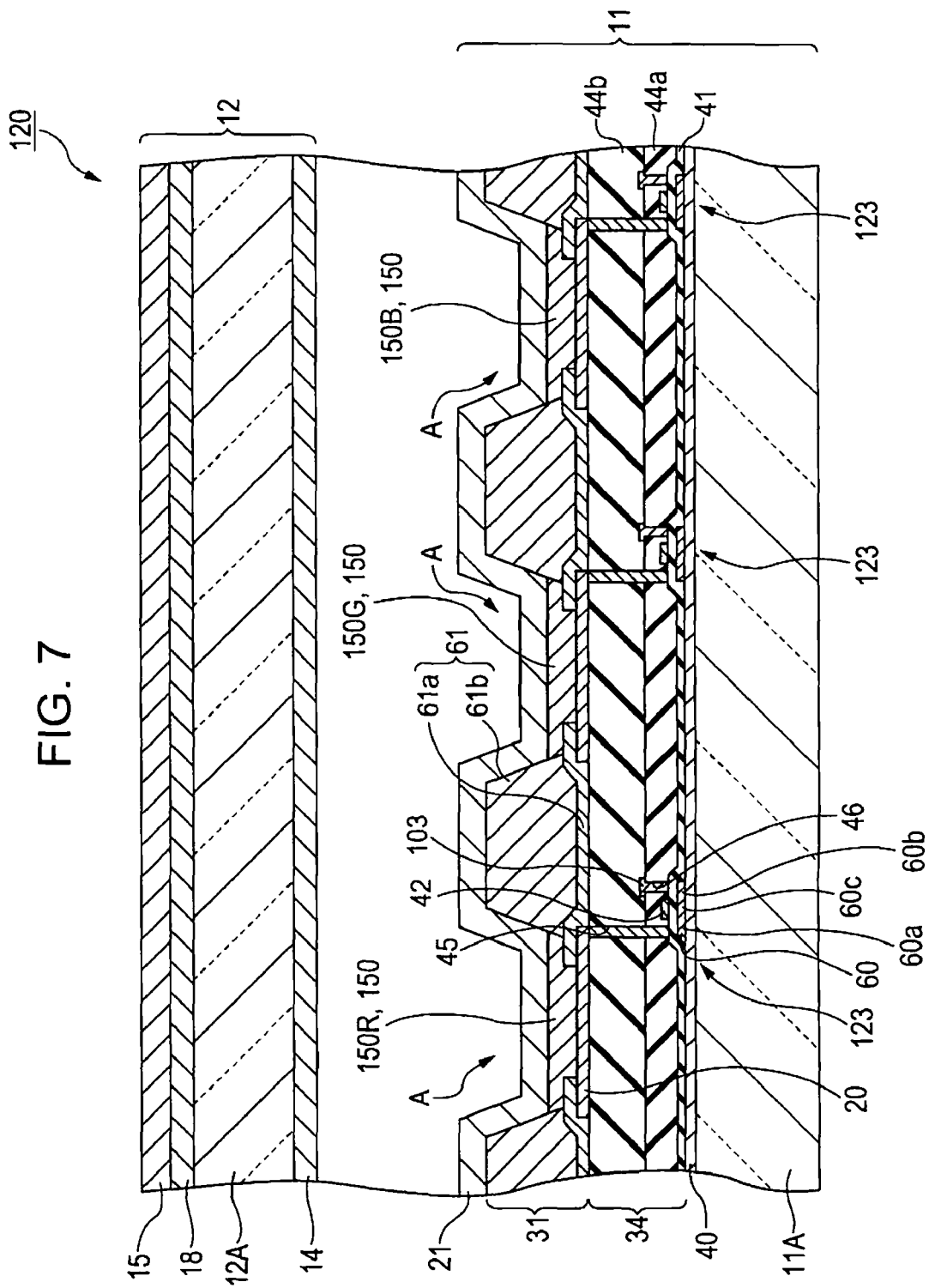
FIG. 7 is a sectional view that schematically illustrates an example of the configuration of an organic electroluminescence device having an input function according to a third exemplary embodiment of the invention.

Next, with reference to the accompanying drawings, an organic EL device having an input function according to a third exemplary embodiment of the invention is explained below. FIG. 7 is a sectional view that schematically illustrates the layer configuration of sub pixel regions. An organic EL device having an input function according to the present embodiment of the invention differs from the organic EL device 1 having an input function according to the first exemplary embodiment of the invention described above only in that, in the present embodiment of the invention, an individual light-emitting material corresponding to one of R, G, and B color components is provided in each of the sub pixel regions, thereby omitting a color filter layer. Except for the above difference, an organic EL device having an input function according to the present embodiment of the invention has the same configuration as that of the organic EL device 1 having an input function according to the first exemplary embodiment of the invention. Accordingly, in the following description, an explanation is given with a focus on the differentiating and characteristic feature described above. It should be noted that the same reference numerals are assigned to the same components as those of the touch-sensitive organic EL device 1 according to the first exemplary embodiment of the invention; and a detailed explanation thereof is omitted, or an explanation is simplified as long as the understanding of the unique feature of the invention is not impaired. It should be further noted that a hole-injection/hole-transportation layer is not illustrated in FIG. 7.

In the configuration of the organic EL device 120 having an input function according to the present embodiment of the invention, as illustrated in FIG. 7, the light-emitting layer 150 is made up of a set of three primary color component layers, that is, a red light emission layer 150R that emits red (R) light, a green light emission layer 150G that emits green (G) light, and a blue light emission layer 150B that emits blue (B) light. Each of these light emission layers 150R, 150G, and 150B is arrayed in a stripe pattern. Having such a configuration, the touch-sensitive organic EL device 120 according to the present embodiment of the invention performs full-color display.

As an example of a modified configuration, lithium fluoride (LiF) may be deposited between the light-emitting layer 150 and the counter electrode 21 in order to improve light emission efficiency. An alternative material other than lithium fluoride may be used for the red light emission layer 150R and the green light emission layer 150G. As another modification example, calcium only may be formed on the red light emission layer 150R and the green light emission layer 150G without forming lithium fluoride.

The organic EL device 120 having an input function according to the present embodiment of the invention offers the same advantageous working effects that are achieved by the organic EL device 1 having an input function according to the first exemplary embodiment of the invention described above. In addition thereto, in the configuration of the touch-sensitive organic EL device 120 according to the present embodiment of the invention, it is not necessary to provide a color filter layer at all, which makes it possible to reduce the thickness of the sealing substrate 12. By this means, the organic EL device 120 having an input function according to the present embodiment of the invention features a reduced size.

Fourth Embodiment

Figure 8:
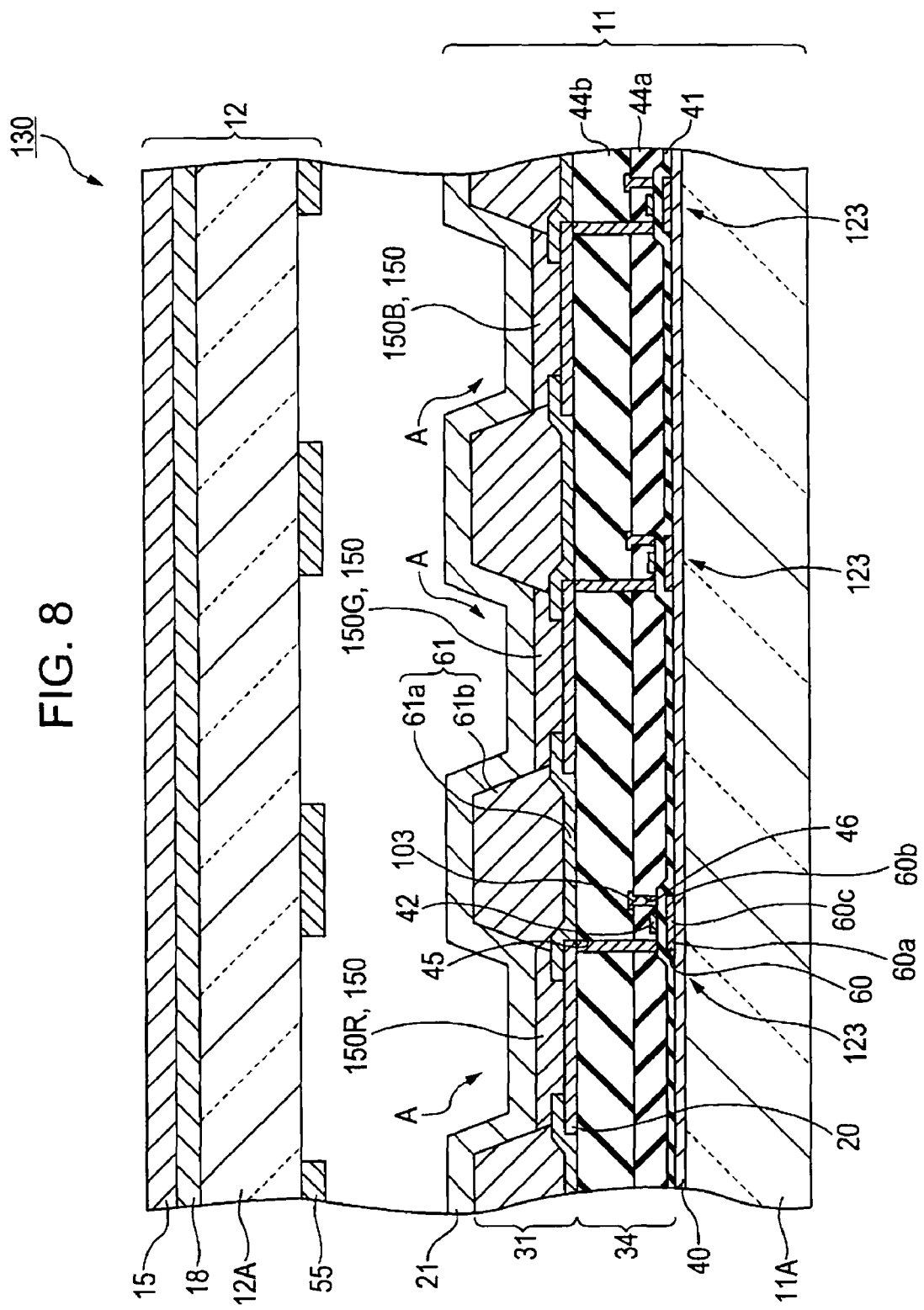
FIG. 8 is a sectional view that schematically illustrates an example of the configuration of an organic electroluminescence device having an input function according to a fourth exemplary embodiment of the invention.

Next, with reference to the accompanying drawings, an organic EL device having an input function according to a fourth exemplary embodiment of the invention is explained below. FIG. 8 is a sectional view that schematically illustrates the layer configuration of sub pixel regions. An organic EL device having an input function according to the present embodiment of the invention differs from the organic EL device 110 having an input function according to the second exemplary embodiment of the invention described above only in that a color filter layer is not provided in the present embodiment of the invention. Except for the above difference, an organic EL device having an input function according to the present embodiment of the invention has the same configuration as that of the organic EL device 110 having an input function according to the second exemplary embodiment of the invention. Accordingly, in the following description, an explanation is given with a focus on the differentiating and characteristic feature described above. It should be noted that the same reference numerals are assigned to the same components as those of the touch-sensitive organic EL device 110 according to the second exemplary embodiment of the invention; and a detailed explanation thereof is omitted, or an explanation is simplified as long as the understanding of the unique feature of the invention is not impaired.

An organic EL device 130 having an input function according to the present embodiment of the invention has the light-shielding portion 55 that is formed on the inner surface (i.e., surface opposed to the element substrate 11) of the base substrate substance 12A of the sealing substrate 12. The light-shielding portion 55 demarcates the sub pixel regions A in a plan view.

The light-shielding portion 55 is made up of the detection-electrode functional portion 56, which functions as the first detection electrode described above, and the light-shielding functional portion 57, which does not function as the first detection electrode described above but functions merely as a light-shielding film. That is, the light-shielding portion (55) of the organic EL device 130 having an input function according to the present embodiment of the invention has the same configuration as that of the light-shielding portion (55) of the organic EL device 110 having an input function according to the second exemplary embodiment of the invention described above.

As understood from the above description, the organic EL device 130 having an input function according to the present embodiment of the invention offers the same advantageous working effects that are achieved by the organic EL device 110 having an input function according to the second exemplary embodiment of the invention described above. In addition thereto, in the configuration of the touch-sensitive organic EL device 130 according to the present embodiment of the invention, it is not necessary to provide a color filter layer at all, which makes it possible to reduce the thickness of the sealing substrate 12. By this means, the organic EL device 130 having an input function according to the present embodiment of the invention features a reduced size.

Electronic Apparatus

Figure 9:
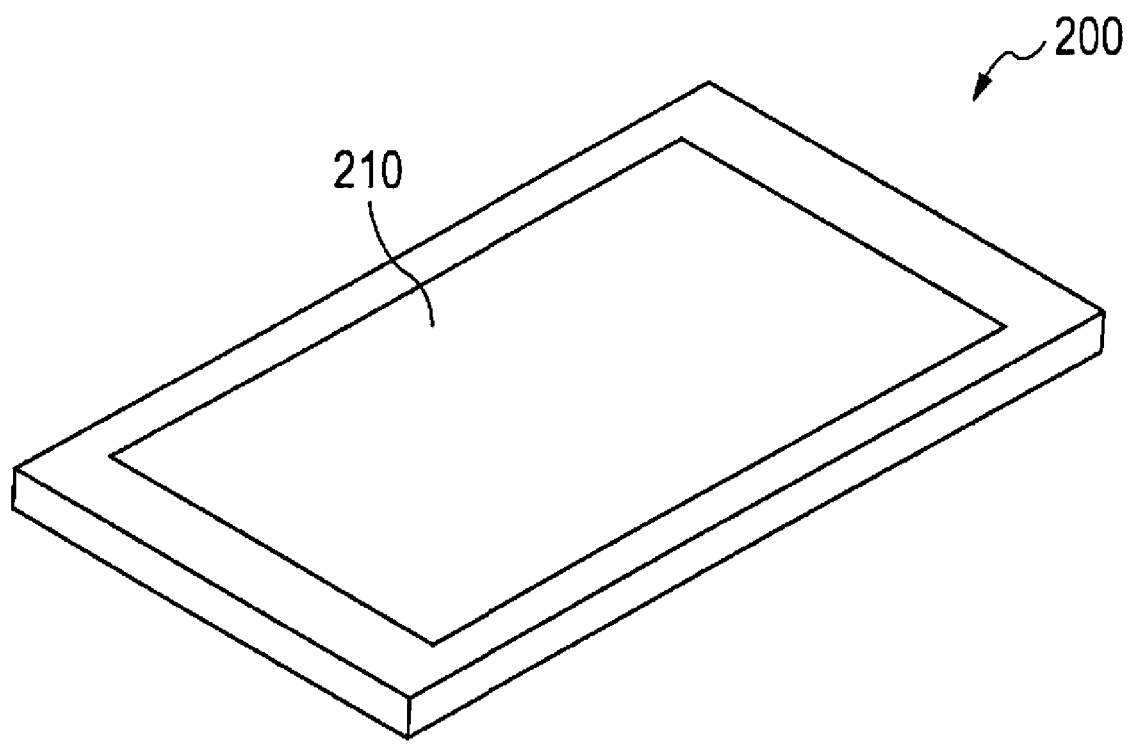
FIG. 9 is a diagram that schematically illustrates an example of the configuration of a personal digital assistant (PDA), which is a non-limiting example of an electronic apparatus according to an exemplary embodiment of the invention.

The touch-sensitive organic EL device 1 having a configuration described above is used, for example, as a display unit 210 of a personal digital assistant (PDA) illustrated in FIG. 9. That is, the PDA 200 is provided with, as its display unit 210, an organic EL device having an input function according to any of exemplary embodiments of the invention described above. The display unit 210 is capable of making a touch-sensitive contact detection by identifying the contact position at which a touching object such as a finger, (the tip of) a pen, or the like are placed thereon.

Since the PDA 200 according to the present embodiment of the invention is provided with, as its display unit 210, the organic EL device 1 having an input function that is capable of making a touch panel contact detection with an enhanced detection accuracy, it features greater performance in the detection of a touch panel user input with an increased reliability.

Although various exemplary embodiments of the present invention are described above, needless to say, the invention is in no case restricted to these exemplary embodiments described herein; the invention may be configured in an adaptable manner in a variety of variations and/or modifications without departing from the spirit thereof. For example, although it is explained in the foregoing exemplary embodiments of the invention that each of the touch-sensitive pads of the first detection electrode and the second detection electrode has the shape of a rhomboid (i.e., diamond), the pad shape of these detection electrodes should not be understood to be limited to such a specific example.

Among a variety of electronic apparatuses to which an organic EL device having an input function according to the foregoing exemplary embodiments of the invention is applicable are, other than the personal digital assistant illustrated in FIG. 9, a mobile personal computer, a notebook-sized personal computer, a mobile phone, a workstation, a digital still camera, a monitor for automobile use, a car navigation device, a head-up display, a digital video camera, a television, a video tape recorder of a viewfinder type or a direct monitor view type, a pager, an electronic personal organizer, an electronic calculator, an electronic book, a projector, a word processor, a videophone, a POS terminal, and so forth.

What is claimed is:

1. An organic electroluminescence device having an input function, comprising:
    an element substrate that has a light-emitting layer sandwiched between a pair of electrodes;
    a sealing substrate that seals the element substrate;
    a first detection electrode that is provided at an inner-surface side of the sealing substrate;
    a second detection electrode that is provided at an outer-surface side of the sealing substrate, the second detection electrode having a detection axis that is not the same as that of the first detection electrode;
    a dielectric film that is formed on the second detection electrode; and
    a detecting section that detects a position at which electrostatic capacitance between the first detection electrode and the second detection electrode is generated, the electrostatic capacitance being generated via the dielectric film.

2. The organic electroluminescence device having an input function according to claim 1, wherein the first detection electrode is configured as a part of a light-shielding film that is formed at the inner-surface side of the sealing substrate.

3. The organic electroluminescence device having an input function according to claim 2, wherein another part of the light-shielding film that does not constitute the first detection electrode has a fixed potential.

4. The organic electroluminescence device having an input function according to claim 1, wherein the pair of electrodes is made up of a positive electrode and a negative electrode; and the negative electrode is formed in a planar pattern on the element substrate.

5. An electronic apparatus that is provided with the organic electroluminescence device having an input function according to claim 1.

6. The organic electroluminescence device having an input function according to claim 1, wherein the inner-surface side of the sealing substrate faces the element substrate and the outer-surface side of the sealing substrate opposes the inner-surface side,
    the first detection electrode is formed on the inner-surface side of the sealing substrate, and
    the second detection electrode is formed on the outer-surface side of the sealing substrate.

* * * * *